(12) United States Patent
Matschullat

(10) Patent No.: US 8,184,922 B2
(45) Date of Patent: May 22, 2012

(54) DIGITAL FILTER CONFIGURATION

(75) Inventor: Frank Matschullat, Hamburg (DE)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 242 days.

(21) Appl. No.: 10/554,530

(22) PCT Filed: Apr. 22, 2004

(86) PCT No.: PCT/IB2004/001226
§ 371 (c)(1),
(2), (4) Date: Oct. 26, 2005

(87) PCT Pub. No.: WO2004/098054
PCT Pub. Date: Nov. 11, 2004

(65) Prior Publication Data
US 2006/0285019 A1    Dec. 21, 2006

(30) Foreign Application Priority Data
Apr. 29, 2003    (EP) .................................... 03101181

(51) Int. Cl.
G06K 9/40    (2006.01)
G06K 9/32    (2006.01)
H04B 15/00    (2006.01)
H04N 9/07    (2006.01)

(52) U.S. Cl. ........ 382/261; 382/260; 382/263; 382/264; 382/298; 382/299; 702/190; 348/267

(58) Field of Classification Search .................. 348/267; 382/260, 261, 263, 264, 298, 299; 702/190
See application file for complete search history.

(56) References Cited

U.S. PATENT DOCUMENTS
5,027,306 A * 6/1991 Dattorro et al. ............... 708/313
5,422,827 A * 6/1995 Niehaus ....................... 702/190
(Continued)

FOREIGN PATENT DOCUMENTS
JP    2000-504520    4/2000
(Continued)

OTHER PUBLICATIONS

Do, et al. "A Flexible Implementation of High-Performance FIR Filters on Xilinx FPGAs." LCNS: Field-Programmable Logic and Applications from FPGAs to Computing Paradigm. 1482/1998. (1998): 441-445. Print.*

*Primary Examiner* — Michael A Newman
(74) *Attorney, Agent, or Firm* — DLA Piper LLP (US)

(57) ABSTRACT

A digital filter configuration for the filtration of a digital video signal, wherein the functions of a zoom filter, in the form of a low-pass filter, which is a polyphase filter, and of at least one peaking filter, in the form of a high-pass filter, are realized, wherein the functions of the two filters are realized in a combined filter (1-17) in an integrated circuit in a manner such that, for each phase of the zoom filter to be set, combined filter coefficients are calculated from filter coefficients stored for this phase of the zoom filter and from filter coefficients stored for the peaking filter, which combined filter coefficients are applied to the video data to be filtered in a filtration process, so that both filtration functions are executed with the combined filter coefficients in this filtration process.

10 Claims, 2 Drawing Sheets

U.S. PATENT DOCUMENTS

| | | | |
|---|---|---|---|
| 5,511,015 A | 4/1996 | Flockencier | |
| 5,648,922 A * | 7/1997 | Han | 708/315 |
| 5,892,695 A | 4/1999 | Van Dalfsen et al. | |
| 5,973,740 A | 10/1999 | Hrusecky | |
| 6,275,781 B1 * | 8/2001 | Maness et al. | 702/182 |
| 6,317,765 B1 | 11/2001 | Page et al. | |
| 6,321,246 B1 | 11/2001 | Page et al. | |
| 6,411,305 B1 * | 6/2002 | Chui | 345/660 |
| 6,424,749 B1 * | 7/2002 | Zhu et al. | 382/260 |
| 6,570,907 B1 * | 5/2003 | Dent et al. | 375/130 |
| 6,642,971 B2 * | 11/2003 | Takeuchi | 348/746 |
| 6,701,024 B1 * | 3/2004 | Sasai | 382/260 |
| 6,941,025 B2 * | 9/2005 | Greenfield et al. | 382/260 |
| 2002/0012390 A1 * | 1/2002 | Kim | 375/229 |
| 2002/0184275 A1 | 12/2002 | Dutta et al. | |
| 2003/0080981 A1 * | 5/2003 | Lin et al. | 345/660 |
| 2003/0154224 A1 * | 8/2003 | Jiang et al. | 708/270 |

FOREIGN PATENT DOCUMENTS

| | | |
|---|---|---|
| WO | 0152546 A2 | 7/2001 |
| WO | 2004055983 | 7/2004 |

* cited by examiner

| Phase | | | | |
|---|---|---|---|---|
| 0 | -6 | 34 | 215 | 13 |
| 1 | -4 | 62 | 190 | 8 |
| 2 | -1 | 80 | 171 | 6 |
| 3 | 0 | 125 | 130 | 1 |
| 4 | 1 | 130 | 125 | 0 |
| 5 | 6 | 171 | 80 | -1 |
| 6 | 8 | 190 | 62 | -4 |
| 7 | 13 | 215 | 34 | -6 |

FIG. 2

| Phase | | | | |
|---|---|---|---|---|
| 0 | 0 | 40 | 221 | 19 |
| 1 | 2 | 68 | 196 | 14 |
| 2 | 5 | 86 | 177 | 12 |
| 3 | 6 | 131 | 136 | 7 |
| 4 | 7 | 136 | 131 | 6 |
| 5 | 12 | 177 | 86 | 5 |
| 6 | 14 | 196 | 68 | 2 |
| 7 | 19 | 221 | 40 | 0 |

FIG. 3

| Phase | | | | |
|---|---|---|---|---|
| 0 | 0 | 40 | 221 | 19 |
| 1 | 2 | 68 | 196 | 14 |
| 2 | 5 | 86 | 177 | 12 |
| 3 | 6 | 131 | 136 | 7 |

FIG. 4

DIGITAL FILTER CONFIGURATION

The invention relates to a digital filter configuration for filtration of a digital video signal. A zoom filter, in the form of a low-pass filter, which is a polyphase filter, and at least one peaking filter, in the form of a high-pass filter, are provided hereby.

Configurations of this kind are known from the prior art, wherein the zoom filter and the peaking filter are generally constructed individually as separate filters in these configurations. In principle, the peaking filter exhibits a filter characteristic for which a specific number of filter coefficients for setting the filter graduation are provided. The zoom filter takes the form of a polyphase filter, i.e. it can realize different filter characteristics as a function of different stored filter coefficients. This filter takes the form of a low-pass filter. Both filters generally serve to process video signals in such a way that the representation of the video signal is zoomed-in on a display, i.e. an enlarged representation is achieved. The zoom filter hereby serves to suppress undesired high-frequency components. The zooming-in gives rise to a loss of definition, which is to be balanced out with the peaking filter.

Known from U.S. Pat. No. 5,422,827 are a configuration and a method of filtering a video signal, in which both a zooming function and a peaking function are realized. With this known method too, however, the disadvantage still exists that the possible filter characteristics saved are all stored individually, and that, for every phase to be newly set, the filter coefficients for the combined filtration are read, from the stored values, from the filter coefficient stored for each phase of the zoom filter and from the filter coefficients of the peaking filter. The memory requirement for storing all possible filter coefficients is therefore considerable.

It is an object of the invention to specify a configuration of the kind mentioned above, in which the filtration functions of the zoom filter and peaking filter are realized in the simplest possible manner, wherein the smallest possible memory requirement exists for each of the stored filter coefficients of the two filters.

This object is achieved in accordance with the invention by means of the features claimed in claim 1:

A digital filter configuration for the filtration of a digital video signal, wherein the functions of a zoom filter, in the form of a low-pass filter, which is a polyphase filter, and of at least one peaking filter, in the form of a high-pass filter, are realized, wherein the functions of the two filters are realized in a combined filter in an integrated circuit in a manner such that, for each phase of the zoom filter to be set, combined filter coefficients are calculated from filter coefficients stored for this phase of the zoom filter and from filter coefficients stored for the peaking filter, which combined filter coefficients are applied to the video data to be filtered in a filtration process, so that both filtration functions are executed with the combined filter coefficients in this filtration process.

In the digital filter configuration in accordance with the invention for filtering a digital video signal, the zoom filter, in the form of a polyphase filter, and the peaking filter are realized in a combined filtration function. In other words, a filter is used in which, de facto, the filter coefficients are the combined filter coefficients calculated from the filter coefficients of the zoom filter and the peaking filter.

Since the zoom filter is a polyphase filter, which may have, for example, 16 different settings, then, in solutions that are part of the prior art, combined filter coefficients must be stored for all these 16 phases with the, for example, 3 filter coefficients of the peaking filter. This gives rise to a considerable memory requirement. Conversely, in the solution in accordance with the invention, the combined filter coefficients are calculated in real time. Account is hereby taken of which phase is set in the zoom filter. The combined filter coefficients are then calculated in real time, in the digital filter configuration, from the filter coefficients of the set phase of the zoom filter and the filter coefficients of the peaking filter, and are used in the combined filter. The storage of the combined filter coefficients for all phases of the zoom filter is thereby dispensed with. Only the storage of the filter coefficients of the polyphase filter per se need take place. Since the combined filter coefficients are of a greater number than the filter coefficients of the zoom filter alone, this gives rise to a saving in memory space.

The combining of the zoom filter and peaking filter further gives rise to an improvement of the filtration function. Given the same filter coefficients, a better peaking function is achieved with the combined filter in accordance with the invention than with individually provided filters with precisely these same filter coefficients.

A further reduction in memory space for the filter coefficients of the polyphase filter is achieved in accordance with one embodiment of the invention as claimed in claim 2. The filter coefficients may have negative values where applicable. In the case of solutions in accordance with the prior art, these negative values are identified in the memory by a particular sign bit. In the solution as claimed in claim 2, all filter coefficients to be stored are subjected to an offset such that negative values no longer occur. The filter coefficients thus subjected to this offset are stored. A memory bit for the sign is hereby no longer necessary. Following the reading-out of the filter coefficients and before their application for the filtration, the offset is cancelled.

In accordance with a further embodiment of the invention as claimed in claim 3, only the filter coefficients of half the phases of the polyphase filter are stored for the polyphase filter. As a result, there is a further halving of the memory requirement. This is possible because the various phases of the polyphase filter are of a nature such that the filter coefficients are in mirror symmetry to each other. Through the filter coefficients of a phase of the polyphase filter, a virtual weighting takes place of various values used for the filtration. The different phases of the filter provide a different weighting of these value ranges. In practice, these weightings proceed with mirror symmetry for the various phases of the polyphase filter. As provided under claim 3, therefore, the obtaining of the filter coefficients of the non-stored phases from the stored phases can be undertaken in a manner such that, with a total number of phases of q, only the phases from $P_1$ to $P_{q/2}$ are stored. If, for example, the set of coefficients of a phase $P_{q-r}$ is to be obtained, the filter coefficients of the phase $P_r$ may be used, reversing their order. Half the filter coefficients can thereby be calculated from the other half, halving the memory requirement for the filter coefficients.

In accordance with a further embodiment of the invention as claimed in claim 4, the combined filter coefficients may advantageously be calculated in accordance with the formula specified in the claim. A quantity of combined filter coefficients thereby arises that is smaller by 1 than the sum of the filter coefficients of the two individual filters. Of significance here is the fact that the combined filter coefficients are calculated in real time and therefore do not have to be stored.

The invention will be further described with reference to examples of embodiments shown in the drawings, to which, however, the invention is not restricted.

FIG. 2 to FIG. 4 show some examples of sets of filter coefficients for the polyphase filter.

Figure 1:
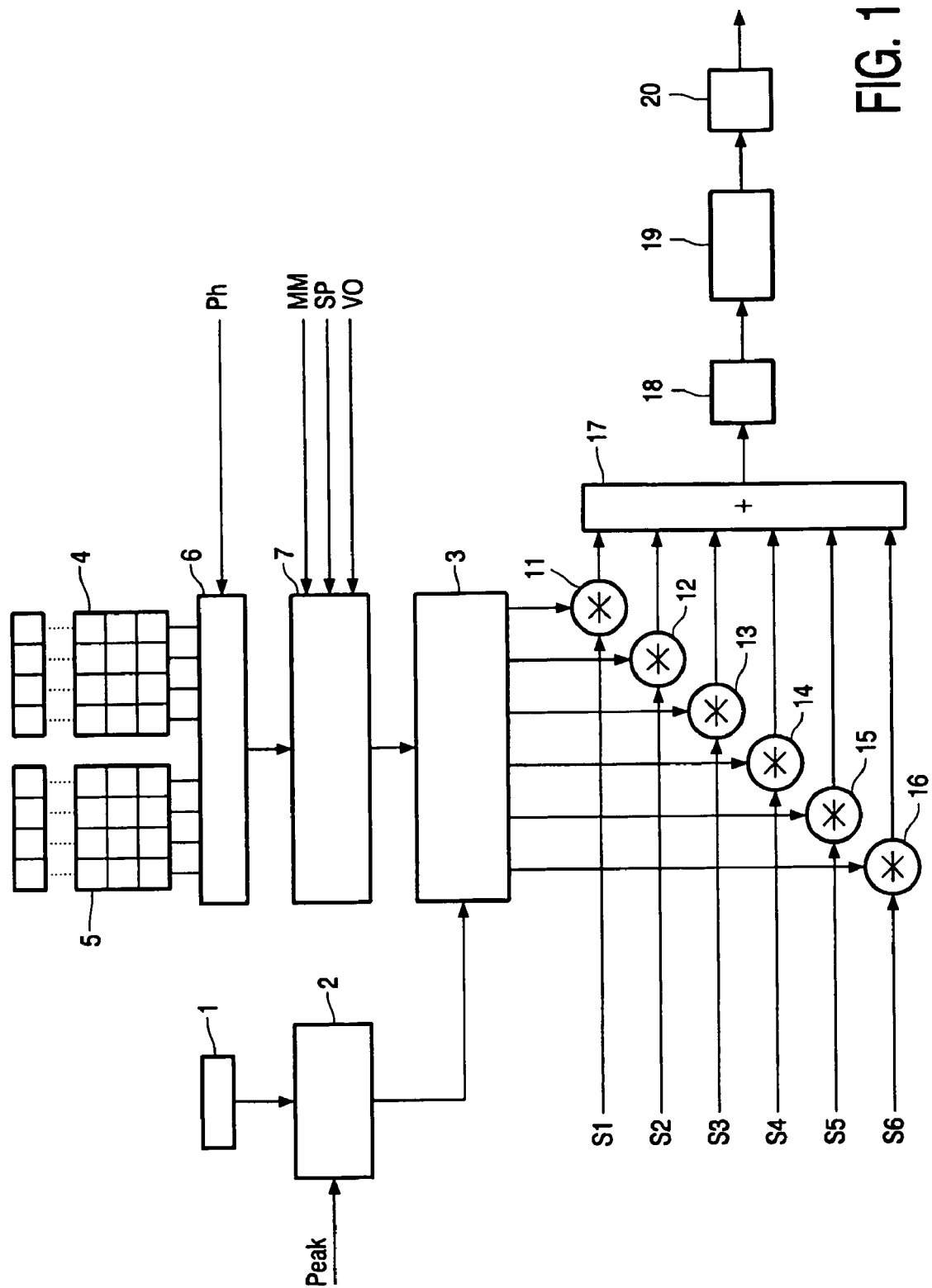
FIG. 1 shows a schematic representation of the digital filter configuration in accordance with the invention with the combined filter.

A filter configuration shown in FIG. 1 in the form of a schematic block circuit diagram serves to filter a digital video signal. Both a zoom filtration function, which involves a low-pass filter, and a peaking function, which involves a high-pass filter, are realized hereby. In the configuration in accordance with the invention, these two filtration functions are realized in a combined filter, which operates with combined filter coefficients. Depending on the setting of the zoom filter, which is a polyphase filter, the combined filter coefficients are calculated in real time.

FIG. 1 shows a memory 1 in which three filter coefficients are stored. These filter coefficients are those of the peaking filter. Also provided is an adjustable mixer 2, by means of which the setting of the intensity of the peaking function can be undertaken as a function of an external signal PEAK. The filter coefficients from memory 1 are hereby varied once more in order to adjust the strength of the peaking function. The filter coefficients for the peaking function, thus varied once more, are sent to a unit 3 for calculation of the combined filter coefficients.

Also provided is a ROM memory 4 in which filter coefficients for one phase of the zoom filter, in the form of a polyphase filter, are stored.

Also provided is a RAM memory 5 in which the particular filter coefficients assigned for the phases of the zoom filter, in the form of a polyphase filter, are stored.

The ROM 4 hereby serves to make available initially one set of filter coefficients during a cold start of the digital filter. Once the configuration has been put into service, the further sets of filter coefficients are written to RAM memory 5 and are available for the various phases. As a function of an external signal Ph, data is read out of the RAM memory 5 in a unit 6 for selection of the set phase as a function of these particular filter coefficients assigned, and passed on to a unit 7 for reconstruction of the filter coefficients. Where applicable, the filter coefficients are not fully stored in the memories 4 and 5, as will be further explained below. The unit 7 can therefore reconstruct the actual filter coefficients as a function of the data reduction brought about with the storage of the filter coefficients. To this end, a signal MM, which indicates whether or not only half the filter coefficients are stored in the memories 4 and 5, is sent to the unit 7. Further, a signal VO, which indicates whether or not the filter coefficients are stored with an offset, is sent to the unit 7. Further, a signal SP, which indicates the total quantity of phases provided, is sent to the unit 7.

From the filter coefficients sent to it from the unit 6, the unit 7 calculates, as a function of the signals MM, SP and VO, the actual filter coefficients. Initially, these are still exclusively the filter coefficients for the zoom filtration function. The unit 7 supplies these filter coefficients for the particular set phase to the unit 3 for calculation of the combined filter coefficients.

In the embodiment example shown in FIG. 1, it is assumed that the zoom filter exhibits four filter coefficients per phase, and the peaking filter three filter coefficients per phase. In this example, the unit 3 for calculation of the filter coefficients calculates six combined filter coefficients, the quantity of which is one less than the sum of the individual filter coefficients of the two filters. These filter coefficients are sent to six multipliers 11 to 16 provided in the filter configuration, to each of which one scanning value, S1 to S6, of the video signal to be filtered is sent. If, for example, a zooming and peaking of the video signal is to take place in the vertical direction, then the scanning values S1 to S6 are the values of six pixels located vertically one above the other in adjacent scanning lines.

In the multipliers 11 to 16, the values of these pixels have the particular filter coefficients applied to them. The values thereby obtained are added up in an adding stage 17. In a rounding stage 18 downstream of this, the values obtained are rounded off, and then divided by a predetermined value in a stage 19, which in turn is downstream of this, as a result of which a scaling of the value to a desired value range is achieved. Since overshoots may occur in the digital signal as a result of the filtration function, a clipping stage 20 is also provided to eliminate these overshoots if they exceed predetermined values. The clipping stage 20 supplies the output signal to the digital filter configuration.

One important advantage of the digital filter configuration in accordance with the invention consists in the fact that the calculation of the combined filter coefficients in the unit 3 takes place in real time, depending on the phase of the zoom filtration function set. The combined filter coefficients do not, therefore, have to be stored for all phases. All that need actually be stored are the non-combined, i.e. individual, filter coefficients of the two filtration functions. And further memory space can be saved hereby, as will be explained below.

The unit 3 for calculation of the combined filter coefficients may, advantageously, undertake its calculation according to the following formula:

$$\text{Coefficient}_k = \sum_{z=0}^{Y-1} F_{2(y-z)} * F_{1(k-y+1+z)}.$$

Here, $F_1$ are the coefficients of a phase of the zoom filter and $x_2$ is its quantity. Correspondingly, $F_2$ are the coefficients of the peaking filter, which exhibits only one phase, and y is its quantity. n is the quantity of the coefficients of the combined filter, which derives from $n=x+y-1$. k is the consecutive number of the coefficient to be calculated, which runs from 1 to n. For each set phase, therefore, the assigned combined set of filter coefficients can be calculated from this formula. This is illustrated with reference to two examples:

EXAMPLE 1

$F_1$=A,B,C,D wherein A is the first coefficient, B is the second coefficient, etc.

$F_2$=E,F,G wherein E is the first coefficient, F is the second coefficient, etc.

| z = 0 | z = 1 | z = 2 |
|---|---|---|
| Coefficient 1: (k = 1, x = 4, y = 3) | | |
| y − z = 3 -> G | y − z = 2 -> F | y − z = 1 -> E |
| k − y + 1 + z = −1 -> 0 | k − y + 1 + z = 0 -> 0 | k − y + 1 + z = 1 -> A |
| => G * 0 + F * 0 + E * A = E * A | | |
| Coefficient 1 = E * A | | |
| Coefficient 2: (k = 2, x = 4, y = 3) | | |
| y − z = 3 -> G | y − z = 2 -> F | y − z = 1 -> E |
| k − y + 1 + z = 0 -> 0 | k − y + 1 + z = 1 -> A | k − y + 1 + z = 2 -> B |
| => G * 0 + F * A + E * B = F * A + E * B | | |
| Coefficient 2 = F * A + E * B | | |

With corresponding application of the above formula, the following is derived for the remaining coefficients:

Coefficient 3 = $C*E + F*B + A*G$

Coefficient 4 = $D*E + C*F + B*G$

Coefficient 5 = $D*F + C*G$

Coefficient 6 = $G*D$

EXAMPLE 2

$F_1$ = E,F,G wherein E is the first coefficient, F is the second coefficient, etc.
$F_2$ = A,B,C,D wherein A is the first coefficient, B is the second coefficient, etc.

| z = 0 | z = 1 | z = 2 | z = 3 |
|---|---|---|---|
| Coefficient 1: (k = 1, x = 3, y = 4) | | | |
| y − z = 4 -> D | y − z = 3 -> C | y − z = 2 -> B | y − z = 1 -> A |
| k − y + 1 + z = −2 -> 0 | k − y + 1 + z = −1 -> 0 | k − y + 1 + z = 0 -> 0 | k − y + 1 + z = 1 -> E |
| D * 0 + C * 0 + B * 0 + A * E = E * A | | | |
| Coefficient 1 = E * A | | | |
| Coefficient 2: (k = 2, x = 3, y = 4) | | | |
| y − z = 4 -> D | y − z = 3 -> C | y − z = 2 -> B | y − z = 1 -> A |
| k − y + 1 + z = −1 -> 0 | k − y + 1 + z = 0 -> 0 | k − y + 1 + z = 1 -> E | k − y + 1 + z = 2 -> F |

D * 0 + C * A + B * E + A * F = F * A + E * B
Coefficient 2 = F * A + E * B

With corresponding application of the above formula, the following is derived for the remaining coefficients:

Coefficient 3 = $C*E + F*B + A*G$

Coefficient 4 = $D*E + C*F + B*G$

Coefficient 5 = $D*F + C*G$

Coefficient 6 = $G*D$

These two examples show that the filter coefficients are "shifted one above another" in a kind of convolution, giving rise to the above-mentioned combined filter coefficients 1 to 6. These combined filter coefficients then realize a combined filtration, during which both the zoom filtration function and the peaking filtration function are realized.

As a result of this calculation of the combined filter coefficients in the unit 3 of the configuration in accordance with FIG. 1, a considerable saving in memory space is obtained, since, depending on the phase set, these combined filter coefficients are calculated in real time and do not have to be stored.

As already explained above, the filter coefficients for the various phases of the zoom filtration function are stored in the memories 4 and 5. FIG. 2 shows a possible set of filter coefficients of this kind for eight phases. In the example shown in FIG. 2, four filter coefficients per phase are assumed for the sake of simplicity. By way of example, therefore, in the example shown in FIG. 2, the filter coefficients for phase 0 would be −6, 34, 215 and 13.

Basically, there is an option of storing the filter coefficients in the memory 5 in the pattern as shown in FIG. 2.

However, a further reduction in memory space can be achieved in the filter configuration in accordance with the invention. To this end, the set of filters shown in the arrangement in FIG. 3 is, in principle, the same as those in FIG. 2, but subjected to an offset such that none of the filter coefficients is smaller than 0. As the set of filter data in FIG. 2 shows, the smallest negative value occurring is the value −6. If the filter coefficients of the data set shown in FIG. 2 are now subjected to an offset of +6, then we derive the filter coefficient sets as shown in FIG. 3. In the filter data set shown in FIG. 3, negative filter coefficients no longer occur. If these filter coefficients are now stored in the version indicated in FIG. 3, the necessity to provide a sign bit no longer applies for storage in this manner. One memory space per filter coefficient is thereby saved.

As the arrangement in FIG. 3 also shows, the filter coefficients are arranged in mirror symmetry to one another, wherein there is a reversal of the order of the filter coefficients. If the filter coefficients of phase 0 are compared with those of phase 7, for example, they are identical if this reversal of the order is applied. The same applies to phases 1 and 6, to phases 2 and 5, and to phases 3 and 4. It is therefore sufficient, as the schematic diagram of FIG. 4 illustrates, to store only the filter coefficients for phases 0 to 3. The filter coefficients for phases 4 to 7 can then be calculated from phases 0 to 3, wherein the above-explained principle is applied for the calculation. As a result, a further reduction, namely a halving, of the necessary memory requirement can be realized in the memory 5.

Overall, as a result of the calculation of the combined filter coefficients being undertaken in real time as a function of the phase of the zoom filter set, and, where applicable, of the further reduction of the data for the various phases of the zoom filtration function, a considerable reduction in memory requirement is achieved with the digital filter configuration in accordance with the invention. This is especially important in practice because memory space demands a relatively large amount of chip surface in integrated circuits.

The invention claimed is:

1. A digital filter configuration for the filtration of a digital video signal, wherein the functions of a zoom filter, in the form of a low-pass filter, which is a polyphase filter, and of at least one peaking filter, in the form of a high-pass filter, are realized, wherein the functions of the two filters are realized in a combined filter in an integrated circuit in a manner such that, for each phase of the zoom filter to be set, combined filter coefficients are calculated in real time according to a summation formula in conjunction with implementation of the filtration of the digital video signal, wherein the combined filter coefficients are calculated from filter coefficients stored for a corresponding phase of the zoom filter and from filter coefficients stored for the peaking filter, wherein each combined filter coefficient comprises a single value derived from a combination of at least one of the filter coefficients stored for the corresponding phase of the zoom filter and at least one of the filter coefficients stored for the peaking filter, which combined filter coefficients are applied to the video data to be filtered in a filtration process, so that both filtration functions are executed with the combined filter coefficients in this filtration process, and further wherein the calculation of the filter coefficients of the combined filter is undertaken in accordance with:

$$Coefficient_k = \sum_{z=0}^{y-1} F_{2(y-z)} * F_{1(k-y+1+z)}$$

where
F$_1$=Coefficients of a phase of the zoom filter,
x=Quantity of the coefficients F$_1$ of a phase of the zoom filter,
F$_2$=Coefficients of the peaking filter,
y=Quantity of the coefficients F$_2$ of the peaking filter,
n=Quantity of the coefficients of the combined filter,
k=Consecutive number of the coefficient to be calculated (1, 2 . . . n) of the combined filter,
wherein: n=x+y−1.

2. A digital filter configuration as claimed in claim 1, characterized in that the filter coefficients for the polyphase filter are stored in a manner such that the value range of the coefficients is subjected to an offset, that negative values no longer occur and therefore no sign bit is stored, and that, following the reading-out of the filter coefficients and before their application in the filter, the offset is cancelled.

3. A digital filter configuration as claimed in claim 1, characterized in that a data reduction of the x filter coefficients for the polyphase filter is applied in a manner such that the filter coefficients are stored for (q/2) of the desired q phases, and that the filter coefficients for the remaining phases are calculated from the stored filter coefficients in a manner such that, in order to calculate a set of coefficients of a phase $P_{q-r}$, the stored filter coefficients of the phase $P_r$ are used, reversing their order, wherein r is the consecutive number of the phase and q is the total number of phases.

4. A digital filter configuration for the filtration of a digital video signal, wherein the functions of a zoom filter, in the form of a low-pass filter, which is a polyphase filter, and of at least one peaking filter, in the form of a high-pass filter, are realized, wherein the functions of the two filters are realized in a combined filter in an integrated circuit in a manner such that, for each phase of the zoom filter to be set, combined filter coefficients are calculated in real time according to a summation formula in conjunction with implementation of the filtration of the digital video signal, wherein the combined filter coefficients are calculated from filter coefficients stored for a corresponding phase of the zoom filter and from filter coefficients stored for the peaking filter, wherein each combined filter coefficient comprises a single value derived from a combination of at least one of the filter coefficients stored for the corresponding phase of the zoom filter and at least one of the filter coefficients stored for the peaking filter, which combined filter coefficients are applied to the video data to be filtered in a filtration process, so that both filtration functions are executed with the combined filter coefficients in this filtration process, further including a peaking filter memory to store the filter coefficients stored for the peaking filter;
a zoom filter memory to store the filter coefficients stored for the zoom filter; and
a calculation unit coupled to receive inputs derived from the peaking filter memory and the zoom filter memory, wherein the calculation unit is configured to calculate the combined filter coefficients, and
further comprising an adjustable mixer coupled between the peaking filter memory and the calculation unit, wherein the adjustable mixer is configured to adjust a strength of the filter coefficients stored for the peaking filter according to an external signal, PEAK, and to send the adjusted filter coefficients for the peaking filter to the calculation unit.

5. A digital filter configuration for the filtration of a digital video signal, wherein the functions of a zoom filter, in the form of a low-pass filter, which is a polyphase filter, and of at least one peaking filter, in the form of a high-pass filter, are realized, wherein the functions of the two filters are realized in a combined filter in an integrated circuit in a manner such that, for each phase of the zoom filter to be set, combined filter coefficients are calculated in real time according to a summation formula in conjunction with implementation of the filtration of the digital video signal, wherein the combined filter coefficients are calculated from filter coefficients stored for a corresponding phase of the zoom filter and from filter coefficients stored for the peaking filter, wherein each combined filter coefficient comprises a single value derived from a combination of at least one of the filter coefficients stored for the corresponding phase of the zoom filter and at least one of the filter coefficients stored for the peaking filter, which combined filter coefficients are applied to the video data to be filtered in a filtration process, so that both filtration functions are executed with the combined filter coefficients in this filtration process, further including a peaking filter memory to store the filter coefficients stored for the peaking filter;
a zoom filter memory to store the filter coefficients stored for the zoom filter; and
a calculation unit coupled to receive inputs derived from the peaking filter memory and the zoom filter memory, wherein the calculation unit is configured to calculate the combined filter coefficients, and further comprising:
a phase selection unit coupled between the zoom filter memory and the calculation unit, wherein the phase selection unit is configured to read out the filter coefficients stored for the phase of the zoom filter from the zoom filter memory in response to an external signal, Ph; and
a reconstruction unit coupled between the phase selection unit and the calculation unit, wherein the reconstruction unit is configured to reconstruct actual filter coefficients as a function of data reduction related to storage of the filter coefficients stored for the phase of the zoom filter.

6. A digital filter configuration as claimed in claim 5, wherein the reconstruction unit is further configured to receive a plurality of signals, wherein the plurality of signals comprise:

a signal MM to indicate whether only half of the filter coefficients for the phase of the zoom filter are stored in the zoom filter memory;
a signal VO to indicate whether the filter coefficients for the phase of the zoom filter are stored with an offset in the zoom filter memory; and
a signal SP to indicate a total quantity of phases;
wherein the reconstruction unit is further configured to calculate the actual filter coefficients as a function of the signals MM, VO, and SP.

7. A digital filter configuration as claimed in claim 5, wherein the reconstruction unit is further configured to calculate each combined filter coefficient is undertaken in accordance with:

$$Coefficient_k = \sum_{z=0}^{y-1} F_{2(y-z)} * F_{1(k-y+1+z)}$$

where
- $F_1$=Coefficients of a phase of the zoom filter,
- x=Quantity of the coefficients $F_1$ of a phase of the zoom filter,
- $F_2$=Coefficients of the peaking filter,
- y=Quantity of the coefficients $F_2$ of the peaking filter,
- n=Quantity of the coefficients of the combined filter,
- k=Consecutive number of the coefficient to be calculated (1,2 ... n) of the combined filter,
- wherein: n=x+y−1.

8. A digital filter configuration as claimed in claim 5, wherein the reconstruction unit is further configured to calculate each combined filter coefficient in real time for each phase of the zoom filter.

9. A digital filter configuration as claimed in claim 5, further comprising:
- a plurality of multipliers coupled to corresponding outputs of the reconstruction unit, wherein each multiplier is configured to multiply one combined filter coefficient and one scanning value; and
- an adding stage coupled to the plurality of multipliers, wherein the adding stage is configured to add up results of the plurality of multipliers.

10. A digital filter configuration as claimed in claim 9, further comprising:
- a rounding stage coupled to an output of the adding stage, wherein the rounding stage is configured to round a result of the adding stage;
- a division stage coupled to an output of the rounding stage, wherein the division stage is configured to divide a result of the rounding stage by a predetermined value to generate a scaled result; and
- a clipping stage coupled to an output of the division stage, wherein the clipping stage is configured to eliminate overshoots in the scaled result relative to a threshold value, wherein the clipping stage supplies an output signal to the digital filter configuration.

* * * * *